United States Patent [19]

Kihara et al.

[11] Patent Number: 5,332,648
[45] Date of Patent: Jul. 26, 1994

[54] POTOSENSITIVE COMPOSITION AND METHOD OF FORMING A PATTERN USING THE SAME

[75] Inventors: Naoko Kihara, Matsudo; Fumihiko Yuasa, Tokyo; Tohru Ushirogouchi, Yokohama; Tsukasa Tada, Tokyo; Osamu Sasaki, Sagamihara; Takuya Naito, Tokyo; Satoshi Saito, Yokohama, all of Japan

[73] Assignee: Kabushiki Kaisha Toshiba, Kawasaki, Japan

[21] Appl. No.: 813,694

[22] Filed: Dec. 27, 1991

[30] Foreign Application Priority Data

Dec. 27, 1990 [JP] Japan .................................. 2-418772
Jun. 24, 1991 [JP] Japan .................................. 3-151942

[51] Int. Cl.⁵ .......................... G03C 1/73; G03F 7/039
[52] U.S. Cl. .................................. 430/270; 430/176; 430/326; 430/914; 430/915; 430/917; 430/330
[58] Field of Search ............... 430/270, 176, 330, 191, 430/192, 193, 326, 917, 914, 915

[56] References Cited

U.S. PATENT DOCUMENTS 4,921,999  5/1990  O'Brien ................................ 560/52
5,173,389  12/1992  Uenishi et al. ........................ 430/192

FOREIGN PATENT DOCUMENTS 2231247  1/1973  Fed. Rep. of Germany .
2610842  9/1976  Fed. Rep. of Germany .
3222484  12/1982  Fed. Rep. of Germany .
3626582  2/1987  Fed. Rep. of Germany .
3733421  4/1988  Fed. Rep. of Germany .
3725741  2/1989  Fed. Rep. of Germany .
6327829  2/1988  Japan .
 272363  3/1990  Japan .
 227660  6/1990  Japan .

OTHER PUBLICATIONS

Statement of relevancy & Patient Structures Considered by the Examiner Feb. 16 1994.

Primary Examiner—Marion E. McCamish
Assistant Examiner—Rosemary Ashton
Attorney, Agent, or Firm—Oblon, Spivak, McClelland, Maier & Neustadt

[57] ABSTRACT

A photosensitive composition comprising: an acid-decomposable compound having at least one substituent which is decomposed by an acid, forming a product which reacts with alkali solution and forms —COO⁻ or —SO₃⁻; and a compound which generates an acid when exposed to a chemical radiation. If necessary, the composition further comprises an alkali-soluble polymer. The acid-decomposable compound is one which is represented by the following formula (1), and the alkali-soluble polymer has a softening point of 150° C. or more and an average molecular weight of 3000 to 8000. When used as photoresist, the composition can form a fine resist pattern.

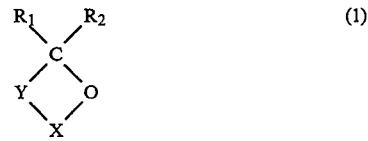

where $R_1$ and $R_2$ are either the same or different, each of which represents at least one selected from the group consisting of hydrogen, halogen atom, cyano group, nitro group, silyl group, and monovalent organic group; X represents $>C=O$ or $-SO_2-$; Y represents a divalent organic group; $R_1$ and $R_2$ can be bonded together, forming a ring; and at least one of $R_1$, $R_2$, and Y has a substituent which is decomposed by an acid.

21 Claims, 1 Drawing Sheet

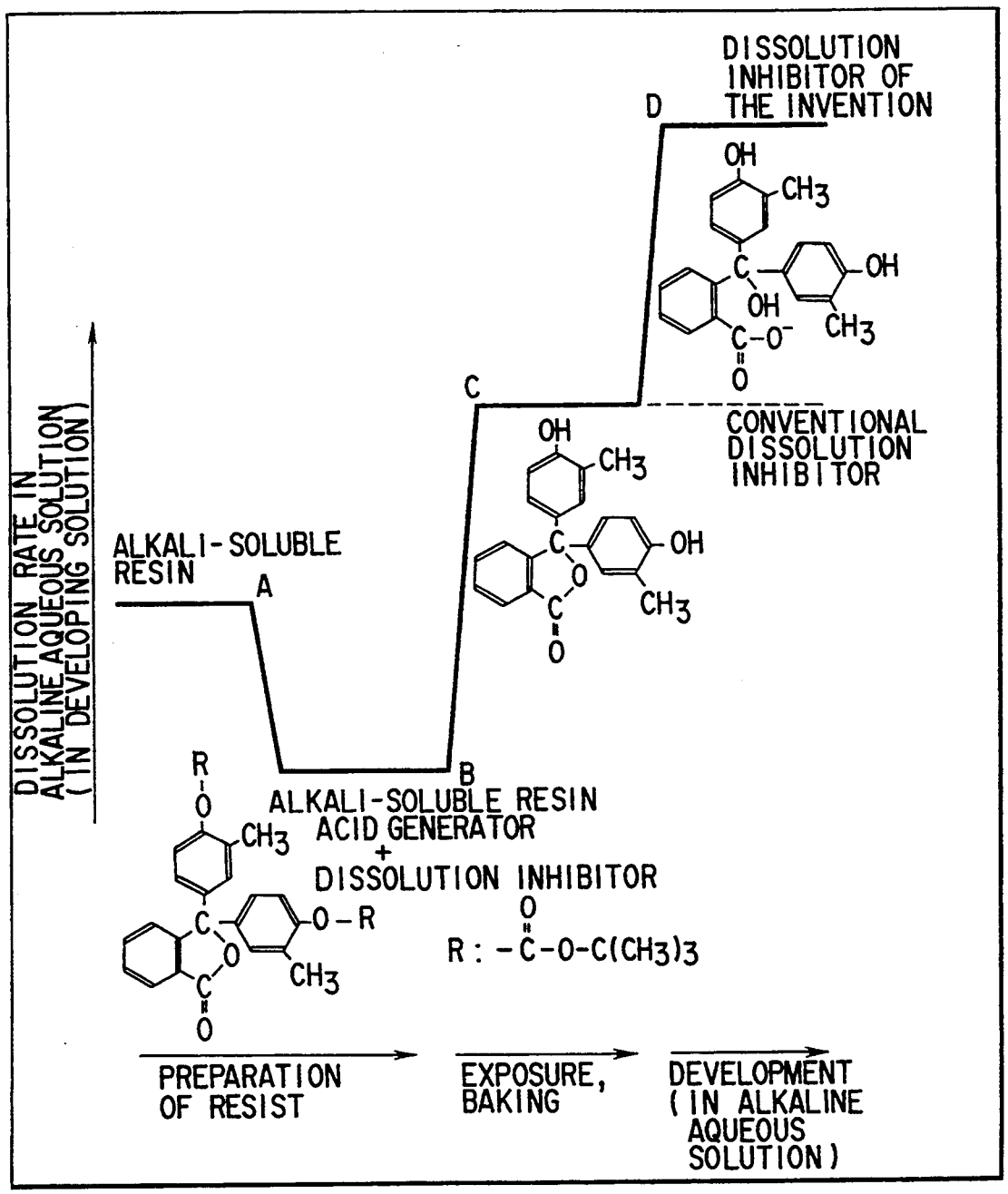
F I G. 1

POTOSENSITIVE COMPOSITION AND METHOD OF FORMING A PATTERN USING THE SAME

BACKGROUND OF THE INVENTION
1. Field of the Invention

The present invention relates to a photosensitive composition suitable for use as photoresist in a method of manufacturing semiconductor devices and a method of forming a pattern using the composition.
2. Description of the Related Art Photoresist is used widely in micro-fabrication of electronic devices, such as semiconductor ICs including LSIs. To impart more functions and a higher integration density to an electronic device, it is necessary to form fine resist patterns.

Resist patterns can be formed by means of a reduction-type projecting mask aligner generally known as "stepper." The light source of the mask aligner can be a g-line (436 nm) of a mercury lamp, an h-line (405 run) of a mercury lamp, an i-line (365 nm) of a mercury lamp, an XeF (351 nm) excimer laser, an XeCl (308 nm) excimer laser, a KrF (248 nm) excimer laser, a KrCl (222 run) excimer laser, an ArF (193 nm) excimer laser, an $F_2$ (157 nm) excimer laser, or the like. The rays emitted from the radiation source are applied to a layer of photoresist, thereby to form a resist pattern. For the microfabricaton, it is necessary to use short wave length radiation, such as excimer or high energy electron beam. Hence, it is greatly demanded that a photoresist be developed which is sensitive to ultraviolet rays of short wavelengths emitted by an excimer laser.

An electron beam and an ion beam, either having a short wavelength, can also be applied to a photoresist layer, thereby to form fine resist patterns. Use of an electron beam or an ion beam is advantageous for enabling to form a resist pattern directly, because the beam can be scanned on a photoresist layer under computer control. It is also demanded that a photoresist be developed which is sensitive to an electron beam and an ion beam.

Two types of resists are known which are sensitive to an excimer laser beam and an electron beam. The first type comprises an azide-series photosensitizer and an acrylic polymer such as polymethacrylate (PMMA) or polyglutarmaleimide (PGMI). The second type comprises an azide-series photosensitizer and a polymer having phenol. The resist of the first type is neither sufficiently sensitive to an excimer laser beam and an electron beam nor sufficiently resistant to dry etching. Although the resist of the second type is adequately resistant to dry etching, a resist pattern formed of it have a cross section shaped like an inverted triangle, and the exposure step and the development step must be performed under precise control.

The recent trend is that the width of the thinnest part of a resist pattern is reduced. This trend raises problems in various methods of exposing resist layers to light. In the case where a resist layer formed on a semiconductor substrate is exposed to light, the reflected light from any stepped portion of the substrate interfere, much affecting the dimensional precision of the resultant resist pattern. In the case where a resist layer is exposed to an electron beam, proximity effect develops due to back scattering of electrons, making it impossible for any part of the resultant resist pattern to have a great height-to-width ratio.

To solve the problems inherent in the above-described resist-patterning processes (hereinafter referred to as "single-layer resist process," so-called "multi-layer resist process" has been developed. This process is briefly described in Solid State Technology, 74 (1981). Further, many studies of resist process have been made and published in the form of theses. Various multi-layer resist processes have been invented. Of these processes, the most commonly tried at present is three-layer resist process using a three-layered resist system. The system comprises a lower layer, an intermediate layer, and an upper layer. The lower layer has a flat upper surface even if the underlying substrate has a rough upper surface, and prevents light reflection from the substrate. The intermediate layer functions as a mask during etching of the lower layer. The upper layer functions as photosensitive one.

The three-layer resist process is advantageous in that it can form a resist pattern more finely than one formed by the single-layer resist process. The process is disadvantageous, however, in that more steps need to be performed than the single-layer resist process. More precisely, many steps must be carried out to form the three-layered resist so that the upper layer is sensitive to an ultraviolet ray having a short wavelength and an ionizing radiation, and the intermediate layer is resistant to dry etching such as reactive ion etching wherein oxygen plasma is applied. This is because there is neither single-layer resist nor multi-layer resist, wherein one layer is not only sensitive to the ultra-violent ray and the ionizing radiation, but also resistant to dry etching.

SUMMARY OF THE INVENTION

The object of the present invention is to provide a photosensitive composition which is sensitive to rays such as ultraviolet rays having short wavelengths and ionizing radiations, is greatly resistant to dry etching, and can be well developed with aqueous alkali solution, and which can therefore be made into a fine resist pattern having a good cross-sectional shape.

The object can be achieved by a photosensitive composition of the present invention which comprises an acid-decomposable compound having at least one substituent which is decomposed by an acid, the compound forming, when decomposed by an acid, a product which reacts with an alkaline solution and forms —COO— or —SO$_3$—, and a compound which generates an acid when exposed to a chemical radiation.

The object of the invention can be attained, also by another photosensitive composition which is identical to the composition described in the preceding paragraph, except that it further comprises an alkali-soluble polymer.

The term "chemical radiation" used above a general name for energy radiations and matter radiations which chemically change photosensitive compositions, and denote, for example, ultraviolet rays having short wavelengths, electron beams, and x rays.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWING

The accompanying drawing, which is incorporated in and constitutes a part of the specification, illustrates presently preferred embodiments of the invention and, together with the general description given above and the detailed description of the preferred embodiments given below, serves to explain the principles of the invention.

FIG. 1 is a graph illustrating how the alkali-solubility of the exposed portions of a photoresist formed of a photosensitive composition according to the invention changes with steps for forming a pattern.

DETAILED DESCRIPTION OF THE PREFERRED EMBODIMENTS

Photosensitive compositions according to this invention will now be described in detail.

A photosensitive composition of this invention contains two compounds as essential components. The first compound is a dissolution inhibitor, i.e., the acid decomposable compound. The second compound is an acid generator, i.e., the compound which generates an acid when exposed to a chemical radiation. The composition is insoluble to an alkaline solution, if not exposed to chemical radiation. Once the composition is exposed to chemical radiation and subjected to baking, the acid generator generates an acid, which decomposes the dissolution inhibitor. The composition can then be dissolved in an alkaline solution.

In the photosensitive composition, the acid-decomposable compound being the dissolution inhibitor makes the whole composition alkali-insoluble unless and until the composition is exposed to a chemical radiation as described above. The acid-decomposable compound has another characteristic; it has at least one specific substituent group and forms, when decomposed by an acid, a product which reacts with an alkaline solution and forms —COO— or —SO$_3$— during development of the composition. Hence, the composition comes to have a higher alkali-solubility as it is exposed to a chemical radiation, baked, and developed.

According the invention, for example, a compound which is represented by the following formula (1) can be used as the acid-decomposable compound:

where R$_1$ and R$_2$ are either the same or different, each of which represents at least one selected from the group consisting of hydrogen, halogen atom, cyano group, nitro group, silyl group, and a monovalent organic group; x represents >C=O or —SO$_2$—; Y represents a divalent organic group; R$_1$ and R$_2$ can be bonded together, forming a ring; and at least one of R$_1$, R$_2$, and Y has a substituent which is decomposed by an acid.

It formula (1), the monovalent organic group represented by R$_1$ or R$_2$ can be a substituted or unsubstituted alkyl group such as methyl, ethyl, propyl, isopropyl, n-butyl and t-butyl; a substituted or unsubstituted aromatic group such as phenyl, tolylnaphtyl, anthranil, and pyridyl; and a substituted or unsubstituted alicyclic or heterocyclic group such as cyclohexyl, piperidyl, and pyranyl.

In formula (1), the divalent organic group represented by Y can be a substituted or unsubstituted aliphatic group such as ethylene, propylene and butylene; a group derived from a substituted or unsubstituted aromatic ring such as benzene, naphthalene, anthracene, phenanthrene, pyridine and piperazine; and a group derived from a substituted or unsubstituted alicyclic or heterocyclic ring such as cyclohexane, pyrazine, pyran and morpholane.

The substituent which is decomposed by an acid incorporated into at least one of R$_1$, R$_2$ and Y can be an ester such as t-butyl ester, isopropyl ester, ethyl ester, methyl ester, and benzyl ester; an ether such as tetrahydropyranyl ether; an alkoxy carbonyl such as tert-butoxycarbonyl (tert-butyl carbonate), methoxycarbonyl (methyl carbonate), and ethoxycarbonyl (ethyl carbonate); and a silyl ether such as trimethylsilyl ether, triethylsilyl ether and triphenylsilyl ether.

Preferably, the compound represented by formula (1) is any one of three compounds which are represented by the following formulas (2), (3), and (4):

Formula (2):

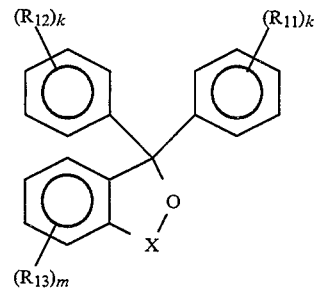

Formula (3):

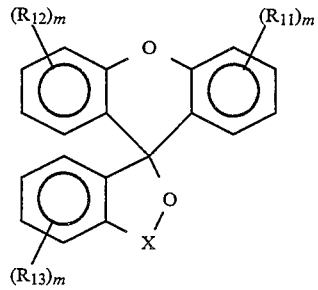

Formula (4):

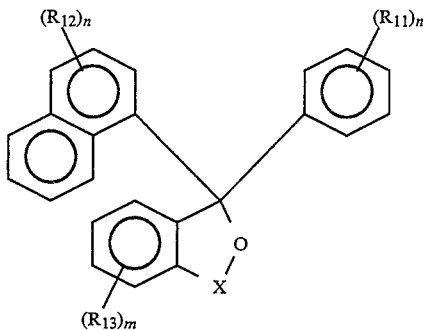

In formulas (2), (3), and (3), R$_{11}$, R$_{12}$, and R$_{13}$ are either the same or different, each of which represents at least one selected from the group consisting of hydrogen, halogen atom, cyano group, nitro group, silyl group, and the monovalent organic groups described above; X represents >C=O or —SO$_2$—; k is an integer ranging from 1 to 5; m is an integer ranging from 1 to 4; n is an integer ranging from 1 to 7; and at least one of $R_{11}$, $R_{12}$, and $R_{13}$ has the above-described substituent which is decomposed by an acid.

As compounds represented by formulas (2), (3), and (4), use can be made of compounds having hydroxyl groups, which are used as their derivatives in which the hydroxyl groups have been converted into the substituents which is decomposed by an acid as described above. More specifically, examples of the compounds having hydroxyl groups are: 3-hydroxy-3-methylphthalide, ascorbic acid, bromocresol green, bromocresol purple, bromocresol blue, bromoxylenol blue, α-chloro-α-hydroxy-o-toluenesulfonic acid-γ-sulfone, chlorophenol red, cresolphthalein, eosin B, eosin Y, fluorescein, fluorescein isocyanate, phenolphthalein, phenol red, tetrabromophenol blue, 3′,3″,5′,5″-tetrabromophenolphthalein, 4,5,6,7-tetrachlorofluorescein, 3′,3″,5′,5″-tetraiodophenolphthalein, thymolphthalein, naphtholphthalein, thymol blue, and the like. Two or more molecules of these compounds can be coupled by at least one of groups having valence of 2 or more, as follows:

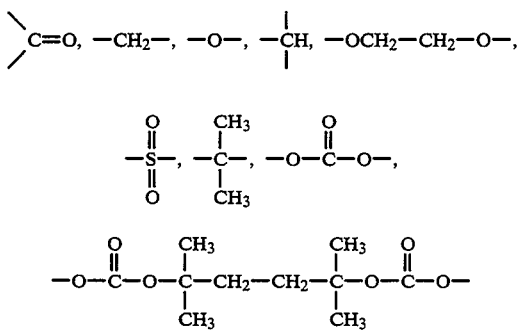

Examples of the compounds, which is used as a compound which generates an acid when exposed to a chemical radiation, that is to say, an acid generator in the photosensitive composition according to the invention, are: onium salts, o-quinonediazide sulfonic chloride, sulfonic acid esters, organic halogen compounds, and the like.

Examples of the onium salt are: diazonium salts, phosphonium salts, sulfonium salts, iodonium salts, each having $CF_3SO_3^-$, p—$CH_3PhSO^-$, p—$NO_2PhSO^-$, or the like which functions as a counter anion. Triarylsulfonium salts and diaryliodonium salts are more suitable for use in the invention. These onium salts are known as acid generators which are very sensitive to a chemical radiation. If a counter anion contained in the onium salt is tetrafluoroborate anion, hexafluoro antimonate anion, or hexafluoroarsenate anion, the acid generated from the onium salt has but insufficient acidity and fails to decompose thoroughly the acid-decomposable compound, i.e., the dissolution inhibitor, in some cases. Every onium salt, that is exemplified above, contains elements which should be expelled from the system in which semiconductor devices are being manufactured. Obviously, the use of the onium salt must be controlled very strictly. In view of this, it is desirable that the onium salt be one whose counter anion is a Lewis base such as methanesulfonate anion, trifluoroacetate anion, trifluoromethanesulfonate anion, toluenesulfonate anion or the like. More specifically, onium salts suitable for use in the invention are: trifluoroacetate, trifluoromethane sulfonate, and toluenesulfonate compound having at least one selected from the group consisting of diphenyliodonium, 4,4′-dibutylphenyliodomium triphenylsulfonium, and t-butyl triphenylsulfonium; and derivatives of these onium salts, in which the phenyl groups are substituted.

The organic halogen compounds, described above, are compounds which form hydrohalogenic acid. Examples of these compounds are those disclosed in U.S. Pat. Nos. 3,515,552, 3,536,489, 3,779,778, and German Offenlegungsschrift 22 43 621.

Examples of other compounds which generate acids when exposed to chemical radiations are those disclosed in Published Unexamined Japanese Patent Applications 54-74728, 55-24113, 55-77742, 60-3626, 60-138539, 56-17345, and 50-36209.

More specifically, examples of the compounds which generate acids when exposed to chemical radiation are: di(p-tert-butylbenzene) diphenyliodonium trifluoromethanesulfonate, benzoine rosylate, o-nitrobenzyl p-toluenesulfonate, triphenylsulfonium trifluoromethanesulfonate, tri(tert-butylphenyl) sulfonium trifluoromethanesulfonate, benzenediazonium p-toluenesulfonate, 4-(di n-propylamino)-benzonium tetrafluoroborate, 4-P-tolyl-mercapto-2,5-diethoxy-benzenediazonium hexafluorophosphate, tetrafluoroborate, diphenylamine-4-diazonium sulfate, 4-methyl-6-trichloromethyl-2-pyrrone, 4-(3,4,5-trimethoxy-styryl)-6-trichloromethyl-2-pyrone, 4-(4-methoxy-styryl)-6-(3,3,3-trichloropropenyl)-2-pyrone, 2-trichloromethyl-benzimidazole, 2-tribromomethyl-quinolone, 2,4-dimethyl-1-tribromoacetyl-benzene, 4-dibromoacetyl-bezoic acid, 1,4-bis-dibromomethyl benzene, tris-dibromomethyl-S-triazine, 2-(6-methoxynaphthyl-2-yl)-4,6-bis-trichloromethyl-S-triazine, 2-(naphthyl-1-yl)-4,6-bis-trichloromethyl-S-triazine, 2-(naphthyl-2-yl)-4,6-bis-trichloromethyl-S-triazine, 2-(4-ethoxyethyl-naphthyl-1-yl)-4,6-bis-trichloromethyl-S-triazine, 2-(benzopyranyl-3-yl)-4,6-bis-trichloromethyl-S-triazine, 2-(4-methoxy-anthracyl-1-yl)-4,6-bis-trichloromethyl-S-triazine, 2-(phenanthryl-9-yi)-4,6-bis-trichloromethyl-S-triazine, o-naphthoquinonediazide-4-sulfonic chloride, and the like.

Compounds represented by the following formulas (5) to (8) can be used, too, as compounds which generate acids when exposed to chemical radiation:

Formula (5):

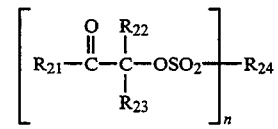

Formula (6):

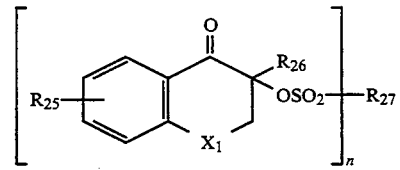

Formula (7):

-continued

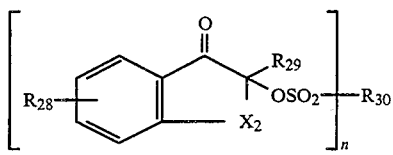

Formula (8):

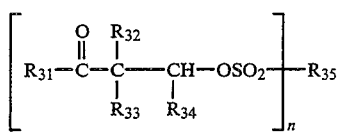

In formulas (5) to (8), $R_{21}$, $R_{22}$, $R_{23}$, $R_{25}$, $R_{26}$, $R_{28}$, $R_{29}$, $R_{31}$, $R_{32}$, $R_{33}$, and $R_{34}$ are either the same or different, each of which represents at least one selected from the group consisting of hydrogen, halogen atom, cyano group, silyl group, and other monovalent organic groups; each of $R_{24}$, $R_{27}$, $R_{30}$, and $R_{35}$ represents an organic group having valence of 1 or more; n indicates the valences of $R_{24}$, $R_{27}$, $R_{30}$, and $R_{35}$; and each of $X_1$ and $X_2$ represents —O—, —S—, —SO$_2$—, —CH$_2$—, —C(R')$_2$—, >N—COR'(R': alkyl group having 1 to 6 carbon atoms or phenyl group).

Examples of groups which can be introduced as $R_{21}$, $R_{22}$, $R_{23}$, $R_{25}$, $R_{26}$, $R_{28}$, $R_{29}$, $R_{31}$, $R_{32}$, $R_{33}$, and $R_{34}$, into the compounds of formulas (5) to (8) are: halogen atoms such as hydrogen, chlorine and bromine; cyano group; silyl groups such as trimethylsilyl, triphenylenesilyl, and the like; alkyl groups such as methyl, ethyl, propyl, isopropyl, n-butyl, sec-butyl, tert-butyl, pentyl, hexyl, cyclohexyl, heptyl, octyl, nonyl, decyl, undecyl, dodecyl, and the like; substituted or unsubstituted aryl groups such as phenyl, naphthyl, and the like; alkoxy groups such as methoxy, ethoxy, propoxy, butoxy, phenoxy, and the like; amino groups such as dimethylamino, diphenylamino, and the like; and substituted or unsubstituted heterocyclic groups.

Examples of heterocyclic compounds from which the substituted or unsubstituted heterocyclic groups are derived: pyrrole, pyrroline, pyrrolidine, indole, isoindole, indoline, isoindoline, indolizine, carbazole, carboline, furan, oxolane, chroman, coumaran, isobenzofuran, phthalan, dibenzofuran, thiophen, thiolan, benzothiophene, dibenzothiophene, pyrazole, pyrazoline, indazole, imidazole, imidazoline, benzimidazole, naphthoimidazole, oxazole, oxazoline, benzoxazole, benzoxazolidine, naphthoxazole, isoxazole, thiazole, thiazoline, thiazolidine, benzothiazoline, naphthothiazole, isothiazole, benzoisothiazole, triazole, benzotriazole, oxadiazole, thiadiazole, benzoxadiazole, benzothiadiazole, tetrazole, purine, pyridine, piperidine, quinoline, isoquinoline, acridine, phenanthridine, benzoquinoline, naphthoquinoline, naphthyridine, phenanthroline, pyridazine, pyrimidine, pyrazlne, phthalazine, quinoxaline, quinazoline cinnoline, phenazine, perimidine, triazine, tetrazine, pteridine, oxazine, benzoxazine, phenoxazine, thiazine, benzothiazine, phenothiazine, oxadiazine, thiadiazine, dioxolane, benzoyloxazole, dioxane, benzodioxane, dithiane, benzodithiane, pyran, chromene, xanthene, oxane, lsochroman, trioxane, thiolane, thiane, trithiane, morpholine, quinuclidine, selenazole, benzoselenazole, naphthoselenazole, terazole, benzoterazole, and the like.

Specific groups which can be introduced as $R_{24}$, $R_{27}$, $R_{30}$, and $R_{35}$ into the compounds of formulas (5) to (8) are monovalent substituents like $R_{21}$, $R_{22}$, $R_{23}$, $R_{25}$, $R_{26}$, $R_{28}$, $R_{29}$, $R_{31}$, $R_{32}$, $R_{33}$, and $R_{34}$, or organic groups which have valence of 2 or more. Examples of the groups whose valences are 2 or more are: substituted or unsubstituted alkylene groups such as methylene, ethylene, propylene, and the like; substituted or unsubstituted methine; groups derived from substituted or unsubstituted aromatic rings, heterocycle, phenylene, diphenylene ether, diphenylenemethane, diphenylenepropane, bisphenylenedimethyl silane; and the groups represented by the formulas shown in Table A which is part of the present application.

Actual examples of the compounds which generate acids when exposed to chemical radiations, represented by formulas (5) to (8) are shown in Table B, which is part of the present application.

In case of the photosensitive composition of the present invention being used as a resist, it is desirable that it comprises the two compounds described above and also an alkali-soluble polymer. This composition is equivalent to so-called three-component "chemical amplification resist." Unless or until the composition is exposed to light, the dissolution inhibitor inhibits the alkali-soluble polymer, which is the resin component, from dissolving in an alkaline solution. After the composition is exposed to light and baked, the acid generator generates an acid, which decomposes the dissolution inhibitor, whereby the alkali-soluble polymer can be dissolved in an alkaline solution.

The alkali-soluble polymer, i.e., the resin component of the photosensitive composition, can be one which has a phenol skeleton. Examples of the alkali-soluble polymer are: phenol novolak resin; cresol novolak resin; xylenol novolak resin; vinylphenol resin; isopropenylphenol resin; a copolymer of vinylphenol and at least one component selected from the group consisting of acrylic acid, a methacrylic acid derivative, acrylonitrile and a styrene derivative. More specific examples are: poly(p-vinylphenol); a copolymer of p-isopropenylphenol and acrylonitrile; a copolymer of p-isopropenylphenol and styrene; a copolymer of p-vinylphenol and methylmethacrylate; and a copolymer of p-vinylphenol and styrene; and the like. Further, the alkali-soluble polymer can be a silicon-containing alkali-soluble polymer such as polysiloxane or polysilane, either having phenol in a side chain, or a novolak resin which is synthesized from phenol and which has silicon in a side chain.

In particular, an alkali-soluble resin which has a softening point of 150° C. or more and an average molecular weight of 3000 to 8000 is preferably used as the alkali-soluble polymer described above. The reasons are as follows.

If an alkali-soluble resin which has a softening point lower than 150° C. is used as the alkali-soluble polymer, an acid, which the acid generator generates upon exposed to a chemical radiation, disperses so widely that its concentration decreases when the composition is baked after the exposure. Since the acid acts on the dissolution inhibitor, but insufficiently. The dissolution inhibitor cannot perform its function completely, nor can the resultant resist patterns have sufficient resolution.

If the alkali-soluble resin has an average molecular weight of less than 3000, it dissolves with an alkaline solution to excess in some cases. If it has an average molecular weight of more than 8000, the polymer chains of the resin may, in some cases, be crosslinked when the composition containing the resin is exposed to an ionizing radiation and then baked. In this case, the composition has an insufficient photosensitivity and cannot form a resist pattern which has sufficient resolution.

Also preferable as the alkali-soluble resin is a resin which has an aromatic ring in its resin skeleton and which is dissolved at 0.1 to 300 nm/sec. in the alkaline developing solution used (usually, 2.38%-aqueous solution of tetramethylammonium hydroxide).

Specific examples of the alkali-soluble resin, which has a softening point of 150° C. or more and an average molecular weight of 3000 to 8000, are novolak resins prepared through condensation polymerization of phenol derivatives, with formaldehyde under acidic condition.

Examples of these novolak resins are: polymers, each containing phenols, cresols, xylenols, ethylphenols, butylphenols, phenol halides, or naphtholes, and the like in its skelecton.

Other examples of alkali-soluble resins are: polyhydroxystyrene, melamine-formaldehyde resin, poly-4-hydroxymaleimide, poly-α-methyl-4-hidroxystyrene, and like.

These resins can be used singly, or in combination in the form of a mixture.

Of the resins described above, a novolak resin which has xylenols in its copolymer composition, has sufficient alkali solubility and heat resistance, as to impart high resolution to the resultant resist pattern, and is therefore particularly preferable as an alkali-soluble polymer which meets the requirements specified above. Such a novolak resin can be one having a copolymer composition which has at least two components selected from the group consisting of 2,5-xylenol, 3,5-xylenol, m-cresol, p-cresol, and o-cresol, in which the copolymer composition contains at least 20 to 60 parts by weight of xylenol. In particular, a novolak resin containing 2,5-xylenol and a novolak resin containing 3,5-xylenol are desirable in particular, since the former excels in alkali-solubility and heat-resistance, and the latter readily interacts with the dissolution inhibitor (i.e., the acid-decomposable compound). These two types of novolak resins can be used, either singly or in combination.

The novolak resin should have a very specific copolymer composition, so as to have a softening point of 150° C. or more and an average molecular weight of 3000 to 8000. More specifically, a copolymer composition of the novolak resin containing 2,5-xylenol preferably comprises 20 to 60 parts by weight of xylenol, 30 to 80 parts by weight of m-cresol, and 0 to 50 parts by weight of p-cresol and o-cresol combined. A copolymer composition of the novolak resin containing 3,5-xylenol preferably comprises 20 to 50 parts by weight of xylenol, 30 to 80 parts by weight of m-cresol, and 0 to 50 parts by weight of o-cresol.

The novolak resin having the copolymer composition as described above can have an average molecular weight which falls in a broad range. To have a high softening point, however, it would be better for the resin to have a low content of low molecular weight substances, such as residual monomers or dimers, as is possible. The resin can have such a sufficiently low content of low molecular weight substances, such as residual monomers or dimers, by removing residual monomers or dimers at an higher degree of reducing pressure and an increased temperature during the synthesis of the novolak resin, or by performing fractional precipitation after the polymerization. Since the component having a higher molecular weight and the component having a lower molecular weight help to raise the softening point and the resolution, of the resultant resist pattern, respectively, the monomers which have intermediate molecular weights can be removed by means of fractional precipitation, thereby controlling molecular weight distribution of the polymer.

Further, as a component of the photosensitive composition of the invention, the novolak resins described above can be substituted, either as a whole or in part, by polyvinylphenol, so that it become more transparent to deep-ultraviolet rays. Examples of this polyvinylphenol are: ordinary poly-vinylphenol; partly reduced poly-vinylphenol for improving on transparency to deep-UV; poly-vinylphenol derivatives wherein some of the hydroxy groups are protected by methyl for controlling dissolution rate, acetyl, butoxycarbonyl, pyranyl, or the like; styrene substituted polyvinylphenol prepared by adding styrene or the like to poly-vinylphenol by using platinum catalyst; and copolymer of styrene and vinylphenol. The content of poly vinylphenol in the novolak resin is preferably 5% by weight, and more preferably 20 to 100% by weight.

If the photosensitive composition of the invention contains an alkali-soluble resin whose softening point is 150° C. or more and whose molecular weight ranges from 3000 to 8000, it is suitable as a chemically sensitized type. If so, the acid-decomposable compound, need not be limited to those above. In other words, the acid-decomposable compound is not limited to the above-specified compounds having special substituents, the compound forming, when decomposed by acid, a product which reacts with an alkaline solution and forms —COO⁻ or —SO₃⁻. In particular, the acid-decomposable compound is not limited to those compounds represented by formula (1). Any compound can be used in the present invention as an acid-decomposable compound provided it can be decomposed by an acid and makes any other component of the composition alkali-insoluble unless or until it is decomposed by an acid. Examples of the acid-decomposable compound are: the compounds disclosed in Published Unexamined Japanese Patent Application 63-27829, and compounds having carboxylic acid groups and/or phenolic hydroxyl groups, all or some of which are substituted by acid-decomposable protective groups. The protective groups can be t-butyl ester, t-butoxycarbonyl (t-butyl carbonate), tetrahydropyranyl and the like.

In a photosensitive composition of the invention which contains an alkali-soluble resin which has a softening point and an average molecular weight, both specified above, a specific acid-decomposable compound such as the compound of formula (1), can fast increase the alkali-solubility of the resin component when the composition is baked after exposure to a chemical radiation. Hence, the use of the specific acid-decomposable compound and the specific alkali-soluble resin (i.e., alkali-soluble polymer) as described above greatly help to form a resist pattern which has an improved resolution.

The contents of the components of the photosensitive composition according to the present invention will now be described.

In the case of the two-component photosensitive composition according to the invention, the amount of the compound which generates an acid when exposed to a chemical radiation should be 0.01 to 20% by weight, preferably 0.2 to 10% by weight, based on the amount of the acid-decomposable compound such as the compound represented by general formula (1).

In the case of the three-component photosensitive composition further containing a alkali-soluble resin according to the invention, the content of the acid-decomposable compound, in particular a compound of formula (1), is 1 to 200 parts by weight, preferably 5 to 100 parts by weight, while the content of the alkali-soluble polymer is 100 parts by weight. If the content of the acid-decomposable compound is less than one part by weight, the composition does not have sufficient photosensitivity. On the other hand, if the content of the acid-decomposable compound is more than 200 parts by weight, the composition does not have sufficient heat resistance, and is not easy to apply to the surface of a semiconductor substrate to form a resist film having a uniform thickness.

In the case of the three-component photosensitive composition according to the invention, the content of the compound which generates an acid when exposed to a chemical radiation (i.e., the acid generator) is 0.01 to 20% by weight, preferably 0.2 to 10% by weight, based on the weight of the solid components of the composition. If the content of the acid-generating compound is less than 0.01% by weight, it does not act on the acid-decomposable compound sufficiently. If the content of the acid-generating compound is more than 20% by weight, it may make the composition hard to coat.

The photosensitive composition according to the present invention is prepared by dissolving the acid-decomposable compound, the compound which generates an acid when exposed to a chemical radiation, and, if necessary, the alkali-soluble polymer, in an organic solvent, thereby forming a solution, and by filtering the solution thus formed. Examples of the organic solvent are: a ketone-series solvent such as cyclohexanone, acetone, methylethyl ketone, methylisobutyl ketone, and the like; a cellosolve-series solvent such as methylcellosolve, methylcellosolve acetate, ethylcellosolve acetate, butylcellosolve acetate, and the like; an ester-series solvent such as ethyl acetate, butyl acetate, isoamyl acetate, $\gamma$-butyrolactone, and the like; dimethyl sulfoxide; dimethyl formamide; and N-methylpyrrolidone; or the like. These organic solvents cam be used singly or in combination. Any of these organic solvents can contain an appropriate amount of an aliphatic alcohol such as xylene, toluene, isopropyl alcohol, or the like.

The photosensitive composition according to the invention can further comprise, if necessary, a surfactant which operates as a film-forming modifier, a proper dye which operates as an antireflection agent, or a polymer such as an epoxy resin, polymethyl methacrylate, polymethyl acrylate, propyleneoxide-ethylenoxide copolymer or polystyrene.

A method of forming a pattern (resist pattern) using the photosensitive composition according to the invention will now be described.

First, the varnish, prepared by dissolving the photosensitive composition in any one of the organic solvents described above, is coated on a substrate by means of spin coating or dipping. The resultant layer of the varnish is dried at 150° C. or less, preferably at 70 to 120° C., thereby forming a resist film. The substrate is, for example, a silicon wafer, a blank mask, or a III-V group compound semiconductor wafer such as a GaAs substrate or an AlGaAs substrate.

Next, the resist film is exposed to a chemical radiation through a mask pattern. The chemical radiation can be an ultraviolet ray, as is commonly used in forming a resist pattern. Alternatively, the radiation can be ultraviolet ray having short-wavelength, electron beam, X-ray, the light emitted from a low-pressure mercury lamp, KrF or ArF excimer laser, synchrotron orbital radiation, $\gamma$-ray, or ion beam.

The resist film, thus exposed to the chemical radiation, is heated, or baked, at 150° C. or less on a hot plate, in an oven, or by means of with infrared radiation (PEB: Post Exposure Bake). Then, the resist film is dipped in, or sprayed with, an alkaline aqueous solution or an organic solvent, and is thereby subjected to development, forming a resist pattern. The alkaline solution, used to develop the resist film, can be an organic aqueous alkaline solution such as aqueous solution of tetramethylammonium hydroxide, or an inorganic aqueous alkaline solution such as aqueous solution of potassium hydroxide or sodium hydroxide. These alkaline aqueous solutions are used in concentration of 15% by weight or less, as usual. After developed, the resist film can be rinsed with water or the like.

In the photosensitive composition of the present invention, the acid-generating compound (i.e., the compound which generates an acid when exposed to a chemical radiation) generates acid when it is exposed to a chemical radiation such as an ultraviolet ray, an electron beam, or the like, and the acid-decomposable compound is decomposed by the acid and ceases to inhibit the alkali-soluble polymer from dissolving in an aqueous alkaline solution. If the acid-decomposable compound is one which is represented by formula (1), the composition is very photosensitive, since the acid-decomposable compound forms a product when the substituent is decomposed by acid, and the product, thus formed, generates $—COO^-$ or $—SO_3^-$ in the aqueous alkaline solution. Hence, any portion of the layer of the photosensitive composition that has been exposed to the chemical radiation (exposed portion) becomes more dissoluble in the aqueous alkaline solution than the other portions. As a result, only the exposed portion is dissolved and removed, whereby the composition layer is made into a positive-type resist pattern.

The above-described changes in the photosensitive composition are conspicuous, particularly if the composition contains an alkali-soluble polymer and is used as a photoresist, as will be explained in detail, with reference to FIG. 1.

FIG. 1 is a graph illustrating how the alkali-solubility of the photosensitive composition according to the invention changes as it is prepared, exposed to light, baked, and developed, if the composition is used as photoresist and contains an alkali-soluble polymer and if the acid-decomposable compound (i.e., the dissolution inhibitor) is synthesized by protecting the hydroxyl groups of cresolphthalein with t-butoxycarbonyl (t-butyl carbonate R). In FIG. 1, time is plotted on the abscissa, and the dissolution rate of the resist in an alkaline developing solution, i.e., the alkali-solubility thereof, is plotted on the ordinate.

First, an alkali-soluble resin is prepared, whose alkali-solubility is at level A. Then, the compound which generates an acid when exposed to a chemical radiation (i.e., the acid generator) and the acid-decomposable compound (i.e., the dissolution inhibitor) are added to the alkali-soluble resin, thereby forming a resist. In the resist, the dissolution inhibitor performs its function. The resist thereby has alkali-solubility at level B which is lower than level A.

Next, the resist (resist layer) is formed. Predetermined portions of the resist layer are selectively exposed to a chemical radiation and subsequently heated, or baked. Then, in each exposed portion of the resist layer, the acid generator generates acid, and the acid, thus generated, decomposes the substituents R of the dissolution inhibitor. Hence, the dissolution inhibitor in the exposed portion regains hydroxyl groups of cresolphthalein and ceases to inhibit the alkali-soluble resin from dissolving in an alkaline solution. As a result, the alkali-solubility of each exposed portion of the resist increases to level C.

Thereafter, the resist layer is developed with an aqueous alkaline solution. Reacting with the alkaline aqueous solution, the dissolution inhibitor contained in each exposed portion of the resist layer generates —COO−, which increases the alkali-solubility of the exposed portion of the resist composition to level D.

Meanwhile, in each unexposed portion of the resist layer, the acid generator generates no acid even if it is baked. Hence, the dissolution inhibitor in the unexposed portion regains no hydroxyl groups of cresol phthalein and continues to inhibit the alkali-soluble resin from dissolving the alkaline developing solution. The alkali-solubility of each unexposed portion of the resist layer, therefore, remains at level B, whereas that of each exposed portion has increased to level D.

Thus, the photosensitive composition according to the present invention can form a positive resist pattern, in which the unexposed portions of the resist layer are not dissolved in an alkaline solution and remained, so as to form the resist pattern.

In the case of a layer formed of the conventional chemical amplification resist, the dissolution inhibitor in each exposed portion is decomposed only in the exposure step and the baking step, and the alkali-solubility of the exposed portion is increased to level C only. By contrast, each exposed portion of the resist layer formed of the photosensitive composition according to the invention undergoes changes not only at the exposure step and baking step, but also at the development step, and has its alkali-solubility increased to level D which is higher than level C. The difference between the alkali-solubility of any exposed portion and that of any unexposed portion is greater than in case of the conventional chemical amplification resist. Therefore, the resist layer formed of the photosensitive composition according to the invention can be processed into a resist pattern having a higher resolution than a resist pattern formed of the conventional chemical amplification resist.

As has been described, the composition according to the present invention, which contains an alkali-soluble polymer, has its alkali-solubility controlled easily at every step of the method for forming a resist pattern. A resist layer formed of this composition can therefore be developed with an aqueous alkaline solution after it has been irradiated with a chemical radiation and subsequently heated. Hence, the resist layer formed of the photosensitive composition do not need to be developed with an organic solvent, it will swell but far less than the conventional resist layer.

In particular, if the alkali-soluble polymer has a phenol skeleton, the composition will be more resistant to heat. If the alkali-soluble polymer not only has a phenol skeleton but also has a softening point of 150° C. or more and a molecular weight of 3000 to 8000, the polymer chains do not be crosslinked when the composition is exposed to a chemical radiation and then baked. In this case, the photosensitive composition will be photosensitive enough to form a resist pattern having a sufficiently high resolution.

Hence, if the photosensitive composition is coated on a substrate, the resultant resist film will be processed into a fine resist pattern having a good profile as it is exposed to a chemical radiation, baked, and then developed with an aqueous alkaline solution. If the resist pattern, thus formed, is used as a etching mask, it will be deformed at no parts while the substrate is being dry-etched, transferring its pattern faithfully onto the surface of the substrate.

The photosensitive composition according to the invention will now be described in more detail, with reference to the following examples.

Synthesis of Dissolution Inhibitor

Acid-decomposable compounds and are to be used as dissolution inhibitor in the photosensitive composition of the invention, were synthesized in the following methods.

SYNTHESIS 1

First, 4.3 g of sodium hydride (oily) was washed with dried toluene three times in a flask, whereby the oil was removed from the sodium hydride. Then, 20 ml of tetra-hydrofuran was added to the washed sodium hydride. The resultant mixture was cooled to −20° C. Next, 15 g (0.047 mol) of phenolphthalein dissolved in 80 ml of tetrahydrofuran was added to the cooled mixture of sodium hydride and tetrahydrofuran, thus forming a mixture. This mixture was stirred for 30 minutes, and 21 g of di-t-butyl dicarbonate was added to the mixture. The resultant mixture was stirred for two hours, poured into a water, and subjected to ether extraction. As a result, 9.6 g of phenolphthalein di-t-butyl carbonate (PP-TBOC) was obtained.

SYNTHESIS 2

Cresolphthalein di-t-butyl carbonate (CP-TBOC) was synthesized in the same procedures as in synthesis 1, except that 0.047 mol of cresolphthalein was used instead of phenolphthalein.

SYNTHESIS 3

Napththolphthalein di-t-butyl carbonate (NP-TBOC) was synthesized in the same procedures as in synthesis 1, except that 0.047 mol of naptholphthalein was used instead of phenolphthalein.

SYNTHESIS 4

Bromothymol blue di-t-butyl carbonate (BP-TBOC) was synthesized in the same procedures as in synthesis 1, except that 0.047 mol of bromothymol blue was used instead of phenolphthalein.

SYNTHESIS 5

Thymolphthalein-di-t-butyl carbonate (TP-TBOC) was synthesized in the same procedures as in synthesis 1, except that 0.047 mol of thymolphthalein was used instead of phenolphthalein.

SYNTHESIS 6

15 g of (0.047 mol) of cresolphthalein and 9 g (1.07 mols) of 3.4-dihydro-2H-pyran were dissolved in 80 ml of tetrahydrofuran, followed by adding 1 ml of hydrochloric acid. The resultant solution was kept stirred at room temperature for one week. After removal of the solvent by an evaporator, the reaction mixture was dissolved in an ether, and the unreacted cresolphthalein was removed with 0.1N sodium hydroxide solution, followed by further washing the reaction product with pure water. The resultant ether phase contained both mono- and di-tetrahydropyranylether compounds of phenolphthalein. The solvent ether was removed first, followed by separating the both compounds from each other by using the column chromatography. The ditetrahydropyranylether compound (CP-THPE) thus obtained was used in the subsequent steps.

SYNTHESIS 7

3.0 g of sodium hydride (oily) was washed with a dried toluene within a flask so as to remove the oil, followed by pouring 20 ml of tetrahydrofuran into the flask for cooling the system to $-20°$ C. Then, 10.5 g (0.033 mol) of phenolphthalein dissolved in 80 ml of tetrahydrofuran was put in the flask. The system was kept stirred for 30 minutes, followed by adding 14.3 g of t-butyl bromoacetate to the system. The resultant system was further stirred for 5 hours and, then, put in water. Further, obtained by ether extraction was 8.5 g of [3,3-bis(4-oxy-t-butylacetate-phenyl)-1-isobenzofuranon], (PP-TBAC) in which the hydroxyl groups of the phenolphthalein were protected with t-butyl acetate.

SYNTHESIS 8

A compound CP-TBAC, in which the hydroxyl group of cresolphthalein is protected with t-butyl acetate, was synthesized by the procedures substantially equal to those in Synthesis 7, except that 0.033 mol of cresolphthalein was used in place of the phenolphthalein used in Synthesis 7.

SYNTHESIS 9

A compound NP-TBAC, in which the hydroxyl groups of naththolphthalein is protected with t-butyl acetate, was synthesized by the procedures substantially equal to those in Synthesis 7, except that 0.033 mol of naphtholphthaleln was used in place of the phenolphthalein used in Synthesis 7.

SYNTHESIS 10

A compound TP-TBAC, in which the hydroxyl groups of thymolphthalein is protected with t-butyl acetate, was synthesized by the procedures substantially equal to those in Synthesis 7, except that 0.033 mol of thymolphthalein was used in place of the phenolphthalein used in Synthesis 7.

PREPARATION OF PHOTOSENSITIVE COMPOSITIONS

The photosensitive compositions according to the invention, hereinafter called "Examples 1 to 31," were prepared, using the ten dissolution inhibitors obtained in Synthesis 1 to 10, acid generators, and phenol resins (i.e., alkali-soluble resins)—each by mixing a dissolution inhibitor, an acid generator, and a phenol resin in the content ratio shown in Table 1, then by dissolving the resultant mixture in ethylcellosolve acetate, and filtering the resultant solution by means of a microfilter having pore size of 0.2 μm.

RESOLUTION PERFORMANCE OF RESIST PATTERNS

Resist patterns were formed by using the 31 photosensitive compositions, i.e., Examples 1 to 31—each by the following method.

First, the photosensitive composition was coated on a silicon wafer by means of a spinner, thus forming a composition layer. Next, the composition layer was dried at 90° C. for five minutes, thereby forming a resist film having a thickness of 1.0 μm. The resist film was exposed to an electron beam or a KrF excimer laser (248 mn) under the condition specified in Table 2, by means of a reduction-type projecting mask aligner (100 mJ/cm$^2$). The resist film was then subjected to post-exposure baking (PEB) on a hot plate under the conditions specified in Table 2. The film, thus baked, was developed with 1.19 wt % aqueous solution of tetramethyl ammonium hydroxide, for about 2 to 7 minutes, whereby a resist pattern was formed.

The surfaces of the resist patterns, thus formed by using the photosensitive compositions of Examples 1 to 31, were observed under a scanning electron microscope (SEM), thereby evaluating the resolution performance of each pattern which had been achieved through subjecting exposure to the resist film with an optimum exposure. The results were as is shown in Table 2.

As is evident from Table 2, Examples 1 to 31 have photosensitivity and resolution performance both being so improved that they are all excellent photoresists.

TABLE 1

| Example | Alkali-soluble resin (X) | Amount of (X) (g) | Dissolution inhibitor (Y) | Amount of (Y) (g) | Acid generator (Z) | Amount of (Z) (g) |
| --- | --- | --- | --- | --- | --- | --- |
| 1 | CR-2 | 80 | PP-TBOC | 20 | 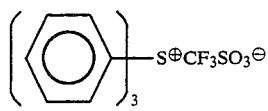 | 1 |
| 2 | CR-2 | 80 | CP-TBOC | 20 | " | 1 |
| 3 | CR-2 | 80 | NP-TBOC | 20 | " | 1 |
| 4 | CR-2 | 80 | BT-TBOC | 20 | " | 1 |
| 5 | CR-1 | 80 | CP-TBOC | 20 | " | 1 |

TABLE 1-continued

| Example | Alkali-soluble resin (X) | Amount of (X) (g) | Dissolution inhibitor (Y) | Amount of (Y) (g) | Acid generator (Z) | Amount of (Z) (g) |
|---|---|---|---|---|---|---|
| 6 | CR-2 | 80 | PP-TBOC | 20 | $CH_3-\langle\bigcirc\rangle-SO_3CH_2COOC(CH_3)_3$ | 7 |
| 7 | CR-2 | 80 | CP-TBOC | 20 | " | 7 |
| 8 | CR-1 | 80 | CP-TBOC | 20 | $(\langle\bigcirc\rangle)_3 S^\oplus CF_3SO_3^\ominus$ | 1 |
| 9 | CR-1 | 70 | CP-TBOC | 30 | " | 1 |
| 10 | CR-2 | 80 | CP-TBOC | 20 | $\langle\bigcirc\rangle-I^\oplus-\langle\bigcirc\rangle-CF_3SO_3^\ominus$ | 1 |
| 11 | CR-1 | 80 | CP-TBOC | 20 | $CH_3-\langle\bigcirc\rangle-SO_3CH_2COOC(CH_3)_3$ | 7 |
| 12 | CR-1 | 70 | CP-TBOC | 30 | " | 7 |
| 13 | CR-2 | 80 | TP-TBOC | 20 | $(\langle\bigcirc\rangle)_3 S^\oplus CF_3SO_3^\ominus$ | 1 |
| 14 | CR-1 | 70 | CP-TBOC | 30 | $(\langle\bigcirc\rangle)_3 S^\oplus CF_3SO_3^\ominus$ | 1 |
| 15 | CR-2 | 70 | CP-TBOC | 30 | " | 1 |
| 16 | CR-3 | 80 | CP-TBOC | 20 | " | 1 |
| 17 | CR-3 | 70 | CP-TBOC | 30 | " | 1 |
| 18 | CR-2 | 80 | CP-TBOC | 20 | $(CH_3)_3C-\langle\bigcirc\rangle-I^\oplus-\langle\bigcirc\rangle-CF_3SO_3^\ominus$ | 1 |
| 19 | CR-2 | 70 | CP-TBOC | 30 | " | 1 |
| 20 | CR-2 | 80 | PP-TBAC | 20 | $(\langle\bigcirc\rangle)_3 S^\oplus CF_3SO_3^\ominus$ | 1 |
| 21 | CR-2 | 80 | CP-TBAC | 20 | $(\langle\bigcirc\rangle)_3 S^\oplus CF_3SO_3^\ominus$ | 1 |
| 22 | CR-2 | 80 | NP-TBAC | 20 | " | 1 |
| 23 | CR-2 | 80 | TP-TBAC | 20 | " | 1 |
| 24 | CR-1 | 80 | CP-TBAC | 20 | " | 1 |
| 25 | CR-2 | 80 | TP-TBAC | 20 | $CH_3-\langle\bigcirc\rangle-SO_3CH_2COOC(CH_3)_3$ | 7 |

TABLE 1-continued

| Example | Alkali-soluble resin (X) | Amount of (X) (g) | Dissolution inhibitor (Y) | Amount of (Y) (g) | Acid generator (Z) | Amount of (Z) (g) |
|---|---|---|---|---|---|---|
| 26 | CR-1 | 80 | TP-TBAC | 20 | $\left(\bigcirc\right)_3 S^{\oplus} CF_3SO_3^{\ominus}$ | 1 |
| 27 | CR-1 | 70 | TP-TBAC | 30 | " | 1 |
| 28 | CR-2 | 80 | TP-TBAC | 20 | $\bigcirc-I^{\oplus}-\bigcirc-CF_3SO_3^{\ominus}$ | 1 |
| 29 | CR-1 | 80 | TP-TBAC | 20 | $CH_3-\bigcirc-SO_3CH_2COOC(CH_3)_3$ | 7 |
| 30 | CR-1 | 70 | TP-TBAC | 30 | " | 7 |
| 31 | CR-1 | 75 | CP-THPE | 25 | $\left(\bigcirc\right)_3 S^{\oplus} CF_3SO_3^{\ominus}$ | 1 |

Alkali-soluble resins CR-1, CR-2, and CR-3, all shown in Table 1, are compounds identified below:

CR-1:

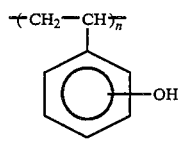

CR-2:
Cresol novolak resin (60% of m-cresol, 40% of p-cresol)

CR-3:

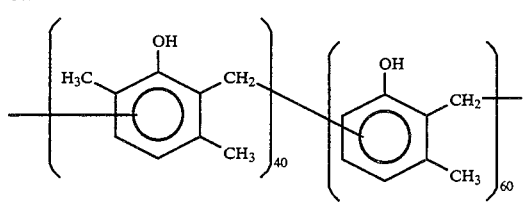

TABLE 2

| Example | Exposure condition | PEB condition | Resolution |
|---|---|---|---|
| 1 | Electron beam irradiation (accelerating voltage: 20 kV) | 100° C., 4 min. | 0.3 μm |
| 2 | Electron beam irradiation (accelerating voltage: 20 kV) | " | " |
| 3 | Electron beam irradiation (accelerating voltage: 20 kV) | " | " |
| 4 | Electron beam irradiation (accelerating voltage: 20 kV) | " | " |
| 5 | Electron beam irradiation (accelerating voltage: 20 kV) | " | " |
| 6 | Electron beam irradiation (accelerating voltage: 20 kV) | " | " |
| 7 | Electron beam | 110°C., 1 min. | " |
| 8 | irradiation (accelerating voltage: 20 kV) Electron beam irradiation (accelerating voltage: 20 kV) | " | " |
| 9 | Electron beam irradiation (accelerating voltage: 20 kV) | " | " |
| 10 | Electron beam irradiation (accelerating voltage: 20 kV) | " | " |
| 11 | Electron beam irradiation (accelerating voltage: 20 kV) | " | " |
| 12 | Electron beam irradiation (accelerating voltage: 20 kV) | " | " |
| 9 | Excimer laser stepper (N,A,0.35) | " | 0.35 μm |

TABLE 2-continued

| Example | Exposure condition | PEB condition | Resolution |
|---|---|---|---|
| 12 | Excimer laser stepper (N,A,0.35) | 100° C., 4 min | " |
| 13 | Electron beam irradiation (accelerating voltage: 20 kV) | " | 0.3 μm |
| 14 | Electron beam irradiation (accelerating voltage: 20 kV) | " | " |
| 15 | Electron beam irradiation (accelerating voltage: 20 kV) | 110° C., 1 min | " |
| 16 | Electron beam irradiation (accelerating voltage: 20 kV) | " | " |
| 17 | Electron beam irradiation (accelerating voltage: 20 kV) | " | " |
| 18 | Electron beam irradiation (accelerating voltage: 20 kV) | " | " |
| 19 | Electron beam irradiation (accelerating voltage: 20 kV) | " | " |
| 5 | Excimer laser stepper (N,A,0.35) | 90°0 C., 5 min | " |
| 14 | Excimer laser stepper (N,A,0.35) | " | " |
| 20 | Electron beam irradiation (accelerating voltage: 20 kV) | 100° C., 4 min. | 0.3 μm |
| 21 | Electron beam irradiation (accelerating voltage: 20 kV) | " | " |
| 22 | Electron beam irradiation (accelerating voltage: 20 kV) | " | " |
| 23 | Electron beam irradiation (accelerating voltage: 20 kV) | " | " |
| 24 | Electron beam irradiation (accelerating voltage: 20 kV) | " | " |
| 25 | Electron beam irradiation (accelerating voltage: 20 kV) | " | " |
| 26 | Electron beam irradiation (accelerating voltage: 20 kV) | 110° C., 1 min. | " |
| 27 | Electron beam irradiation (accelerating voltage: 20 kV) | " | " |
| 28 | Electron beam irradiation (accelerating voltage: 20 kV) | " | " |
| 29 | Electron beam irradiation (accelerating voltage: 20 kV) | " | " |
| 30 | Electron beam irradiation (accelerating voltage: 20 kV) | " | " |
| 31 | Electron beam irradiation (accelerating voltage: 20 kV) | " | 0.7 μm |
| 27 | Excimer laser stepper (N,A,0.35) | " | 0.35 μm |
| 30 | Excimer laser stepper (N,A,0.35) | 100° C., 4 min | " |

SYNTHESIS OF ALKALI-SOLUBLE POLYMERS

Alkali-soluble polymers, which are used in the present invention and which have a softening point of 150° C. or more and an average molecular weight of 3000 to 8000, were synthesized in the following methods.

SYNTHESIS OF NOVOLAK RESINS

Ten different novolak resins a to j, each having a softening point and an average molecular weight, both satisfying the above-mentioned values, were synthesized, each by the following method.

First, 1 mol of two or more phenol derivatives, in which at least one of them xylenol, was poured into a separable flask. Next, 0.5 mol of 36%-formaldehyde aqueous solution, 1 g of oxalic acid, and 12 cc of water were added to this monomer, and left to react with the monomer at 60° C. for six hours. Thereafter, the system was heated to 200° C. The pressure in the system was reduced, thereby fractionating out the residual component having lower molecular weight. Then, the temperature of the system was lowered, thereby yielding a novolak resin.

Table 3 shows the formulas, softening points, and average molecular weights of the novolak resins a to j, thus prepared.

SYNTHESIS OF VINYLPHENOL RESINS

Five different vinylphenol resins k to o, which will be specified below, were prepared or synthesized. Table 3 shows the formulas, softening points, and average molecular weights of these resins k to o.

Resin k: Vinylphenol resin having transparency improved due to the hydrogen addition (PHM, manufactured by Maruzen Petrochemical Co., Ltd.)

Resin 1: Styrenized resin M (SM) prepared by adding styrene to vinylphenol in the presence of platinum catalyst.

Resin m: Copolymer of vinylphenol and styrene (CST)

Resin n: Vinyl phenol derivative, synthesized by reacting t-butyl acetate with vinylphenol resin k, using potassium carbonate and potassium iodide as catalysts, thereby protecting some of the hydroxyl groups of vinylphenol resin k.

Resin o: Vinylphenol derivative, synthesized by reacting vinylphenol resin k with sodium hydride, converting part of some of the hydroxyl groups of resin k into sodium salt, and then with di-t-butyl dicarbonate, thereby protecting the remaining hydroxyl groups with t-butoxycarbonyl groups.

Of the resins shown in Table 3, any copolymer composed of two or more types of repeating units can have any structure, such as block structure or random structure.

ACID GENERATORS

Use was made of the acid generators listed in Table 4.

TABLE 3

| Symbol | Alkali-soluble resin (copolymer composition) | Molecular weight (Mw) | Softening point (°C.) |
|---|---|---|---|
| a | 2,3,5-trimethylphenol novolak (homopolymer) | 3210 | 150 |
| b | 2,3,5-trimethylphenol / 2,5-dimethylphenol copolymer (60/40) | 3550 | 150 |
| c | 2,3,5-trimethylphenol / 2,5-dimethylphenol copolymer (40/60) | 4100 | 154 |
| d | 2,3,5-trimethylphenol / 2,5-dimethylphenol copolymer (30/70) | 3950 | 153 |
| e | 2,3,5-trimethylphenol / 2,5-dimethylphenol / 2,4-dimethylphenol terpolymer (30/45/25) | 7230 | 156 |
| f | 3,5-dimethylphenol novolak (homopolymer) | 5840 | 160 |
| g | 3,5-dimethylphenol / 2,5-dimethylphenol copolymer (50/50) | 4100 | 155 |

TABLE 3-continued
| Symbol | Alkali-soluble resin (copolymer composition) | Molecular weight (Mw) | Softening point (°C.) |
|---|---|---|---|
| h | 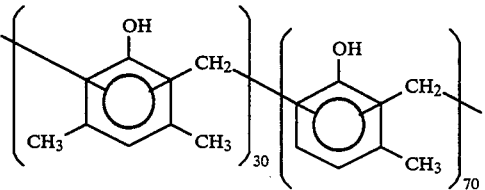 | 3500 | 155 |
| i | 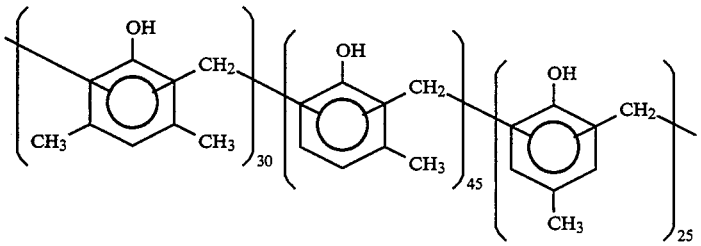 | 3500 | 150 |
| j | 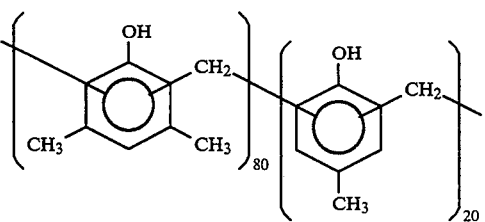 | 3420 | 150 |
| k | 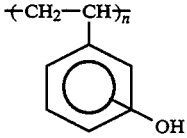 | 6000 | 170 |
| l | 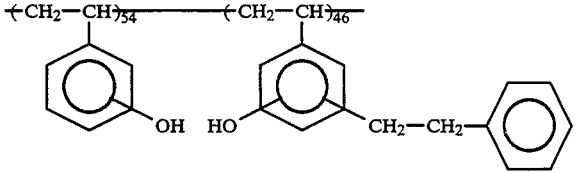 | 6100 | 180 |
| m | 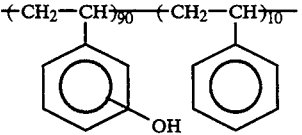 | 5400 | 170 |
| n | 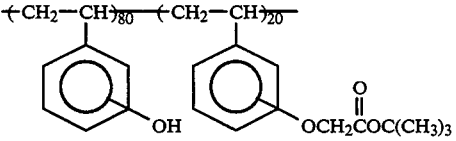 | 6100 | 165 |
| o | 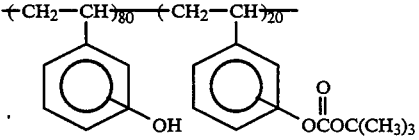 | 6100 | 160 |

TABLE 4

| Symbol | Structural formula |
|---|---|
| A | $[(\text{C}_6\text{H}_5)_3\text{S}]^+ \text{CF}_3\text{SO}_3^-$ |
| B | $\text{CH}_3\text{-C}_6\text{H}_4\text{-SO}_3\text{CH}_2\text{COOC(CH}_3)_3$ |
| C | $[(\text{C}_6\text{H}_5)\text{-I-(C}_6\text{H}_4)]^+ \text{CF}_3\text{SO}_3^-$ |

PREPARATION OF PHOTOSENSITIVE COMPOSITIONS

The photosensitive compositions according to the invention, hereinafter called "Examples 32 to 56," were prepared, using the novolak resins, the phenol resins, the acid generators, and the dissolution inhibitors PP-TBOC, CP-TBOC, NP-TBOC, and BI-TBOC represented by formula given below in various content ratios specified in Table 5—each by a method similar to the method of forming photosensitive compositions of Examples 1 to 31.

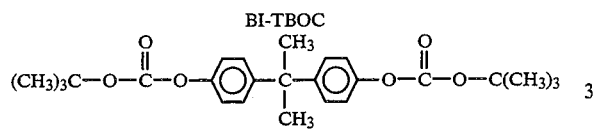

BI-TBOC
$(\text{CH}_3)_3\text{C-O-C(O)-O-C}_6\text{H}_4\text{-C(CH}_3)_2\text{-C}_6\text{H}_4\text{-O-C(O)-O-C(CH}_3)_3$

RESOLUTION PERFORMANCE OF RESIST PATTERNS

Resist patterns were formed by using the 25 photosensitive compositions, i.e., Examples 32 to 56—each by the following method.

First, the photosensitive composition was coated on a silicon wafer by means of a spinner, thus forming a composition layer. Next, the composition layer was dried at 90° C. for two minutes, thereby forming a resist film having a thickness of 1.0 μm. The resist film was exposed to an electron beam (acceleration voltage: 20 kV) or a KrF excimer laser (248 mn) by means of a reduction-type projecting mask aligner (100 mJ/cm²). The resist film was then baked on a hot plate, at 90° C. for 30 minutes if the film had been exposed to an electron beam, and at 80° C. for five minutes if the film had been exposed to the KrF excimer laser. The film, thus baked, was developed with 2.38 wt% aqueous solution of tetramethyl ammonium hydroxide, whereby a resist pattern was formed.

The surfaces of the resist patterns, thus formed from Examples 32 to 56, were observed under a scanning electron microscope (SEM), thereby evaluating the resolution performance of each pattern. The results were as is shown in Table 6. Table 6 also shows the light sources used to form the resist films. As is evident from Table 6, Examples 32 to 56 have high photosensitivity and excellent resolution performance. Particulary, the alkali-soluble resin used in Example 56 satisfies the conditions of the preferred softening point and average molecular weight. This indicates that excellent sensitivity and resolution can be imparted to the resists pattern by using optional acid-decomposable compounds in place of the specified compounds such as those defined by formula (1). The dissolution inhibitors used in Examples 32 to 55 are acid-decomposable compounds of formula (1). Nonetheless, other acid-decomposable formulas can be used instead, since the alkali-soluble resins used in Examples 32 to 55 have preferable softening points and preferable average molecular weights.

TABLE 5

| Example | Composition (weight %) (resin: acid generator: dissolution inhibitor) | Alkali-soluble resin | Acid generator | Disslution inhibitor |
|---|---|---|---|---|
| 32 | 72:1:27 | a | A | CP-TBOC |
| 33 | 72:1:27 | b | A | CP-TBOC |
| 34 | 78:1:21 | c | A | PP-TBOC |
| 35 | 72:1:27 | c | A | CP-TBOC |
| 36 | 66:7:27 | c | B | CP-TBOC |
| 37 | 72:1:27 | c | C | CP-TBOC |
| 38 | 72:1:27 | d | A | CP-TBOC |
| 39 | 72:1:27 | e | A | CP-TBOC |
| 40 | 81:1:18 | f | A | CP-TBOC |
| 41 | 81:1:18 | g | A | CP-TBOC |
| 42 | 81:1:18 | h | A | CP-TBOC |
| 43 | 81:1:18 | i | A | PP-TBOC |
| 44 | 81:1:18 | i | A | CP-TBOC |
| 45 | 81:1:18 | i | A | NP-TBOC |
| 46 | 81:1:18 | j | A | CP-TBOC |
| 47 | 71:1:28 | k | A | CP-TBOC |
| 48 | 71:1:28 | i + k (50:50) | A | CP-TBOC |
| 49 | 71:1:28 | i + k (50:50) | A | CP-TBOC |
| 50 | 71:1:28 | i + l (30:70) | A | CP-TBOC |
| 51 | 71:1:28 | i + m (20:80) | A | CP-TBOC |
| 52 | 71:1:28 | i + n (40:60) | A | CP-TBOC |
| 53 | 71:1:28 | i + o (40:60) | A | CP-TBOC |
| 54 | 71:1:28 | l | A | CP-TBOC |
| 55 | 79:1:20 | m | A | CP-TBOC |
| 56 | 81:1:18 | e | A | BI-TBOC |

TABLE 6

| Example | Light source | Sensitivety | Resolution (μm) | Sectional shape of the pattern |
|---|---|---|---|---|
| 32 | EB | 30 μC/cm² | 0.6 | ⊐⊏ |
| 33 | EB | 15 μC/cm² | 0.3 | ▽ |
| 34 | EB | 14 μC/cm² | 0.3 | ▽ |
| 35 | EB | 7 μC/cm² | 0.3 | ▽ |
| 35 | KrF. excimer laser | 110 mJ/cm² | 0.4 | ⋀ |
| 36 | EB | 20 μC/cm² | 0.3 | ⋀ |
| 37 | EB | 10 μC/cm² | 0.3 | ▽ |
| 38 | EB | 6 μC/cm² | 0.3 | ▽ |

TABLE 6-continued

| Example | Light source | Sensitivety | Resolution (μm) | Sectional shape of the pattern |
|---|---|---|---|---|
| 39 | EB | 15 μC/cm² | 0.5 | |
| 40 | EB | — | — | not resolved |
| 41 | EB | 10 μC/cm² | 0.4 | |
| 42 | EB | 8 μC/cm² | 0.3 | |
| 43 | EB | 10 μC/cm² | 0.4 | |
| 44 | EB | 7 μC/cm² | 0.25 | |
| 44 | KrF. excimer laser | 120 mJ/cm² | 0.35 | |
| 45 | EB | 12 μC/cm² | 0.3 | |
| 46 | EB | 10 μC/cm² | 0.3 | |
| 47 | EB | 7 μC/cm² | 0.3 | |
| 47 | KrF. excimer laser | 90 mJ/cm² | 0.35 | |
| 48 | EB | 8 μC/cm² | 0.35 | |
| 48 | KrF. excimer laser | 100 mJ/cm² | 0.35 | |
| 49 | EB | 10 μC/cm² | 0.4 | |
| 49 | KrF. excimer laser | 120 mJ/cm² | 0.4 | |
| 50 | EB | 20 μC/cm² | 0.4 | |
| 50 | KrF. excimer laser | 140 mJ/cm² | 0.4 | |
| 51 | EB | 20 μC/cm² | 0.4 | |
| 51 | KrF. excimer laser | 150 mJ/cm² | 0.4 | |
| 52 | EB | 5 μC/cm² | 0.3 | |
| 52 | KrF. excimer laser | 80 mJ/cm² | 0.3 | |
| 53 | EB | 5 μC/cm² | 0.3 | |
| 53 | KrF. excimer laser | 75 mJ/cm² | 0.3 | |
| 54 | EB | 20 μC/cm² | 0.5 | |
| 54 | KrF. excimer laser | 170 mJ/cm² | 0.4 | |
| 55 | EB | 25 μC/cm² | 0.5 | |
| 55 | KrF. excimer laser | 220 mJ/cm² | 0.4 | |
| 56 | EB | 7 μC/cm² | 0.5 | |

The following example is directed to a binary photosensitive composition, which is the most basic composition of the present invention, i.e., a photosensitive composition comprising an acid-decomposable compound and a compound which generates an acid when exposed to a chemical radiation.

EXAMPLE 57

Specifically, 2.0 g of cresolphthalein di-t-butyl carbonate and 0.02 g of triphenylsulfonium trifurate were dissolved in 5 g of ethylcellosolveacetate, followed by filtering the resultant solution with a filter having pore size of 0.2 μm so as to obtain a photosensitive composition. A silicon wafer was coated with the photosensitive composition using a spinner. The coating was dried at 90° C. for 5 minutes so as to obtain a film having thickness of 1.0 μm. The sensitivity of the photosensitive composition film to an ultraviolet ray having a wavelength of 251 nm was found to be 5 mJ/cm². As has been described, the present invention can provide a composition which has high photosensitivity, excellent resolution performance, and high heat resistance, and serves to etching a substrate, thereby to transfer a pattern faithfully onto the substrate, and can effectively be used in the photoetching step of the method for manufacturing semiconductor devices having high integration density.

TABLE A
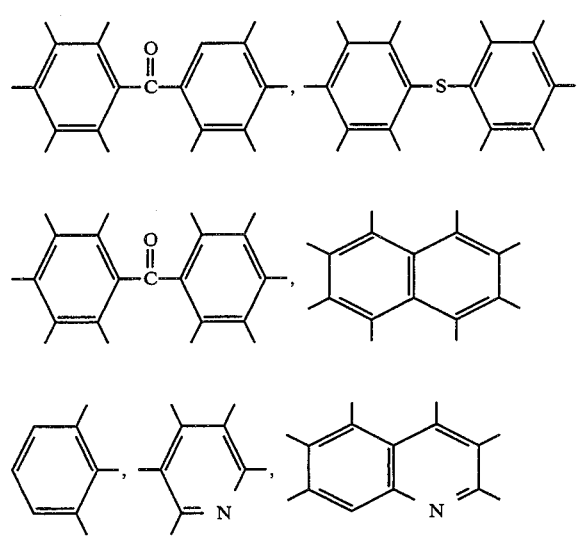
TABLE B
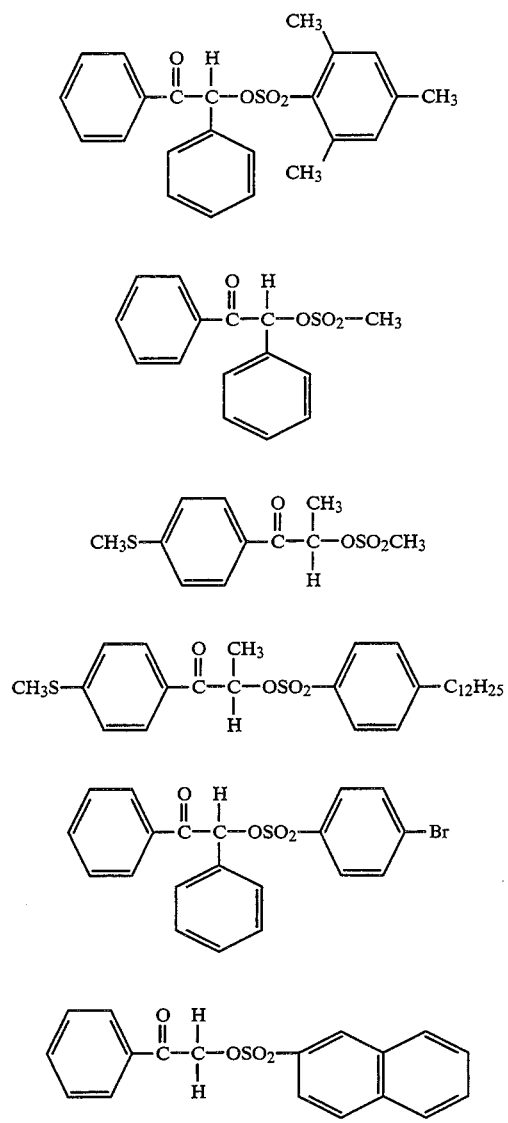
TABLE B-continued
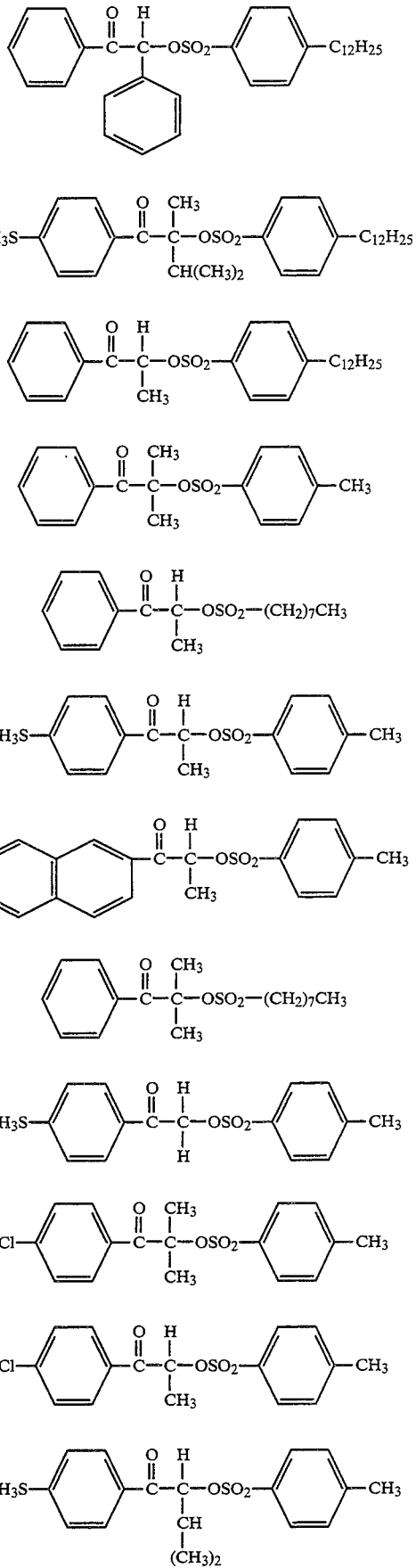

TABLE B-continued
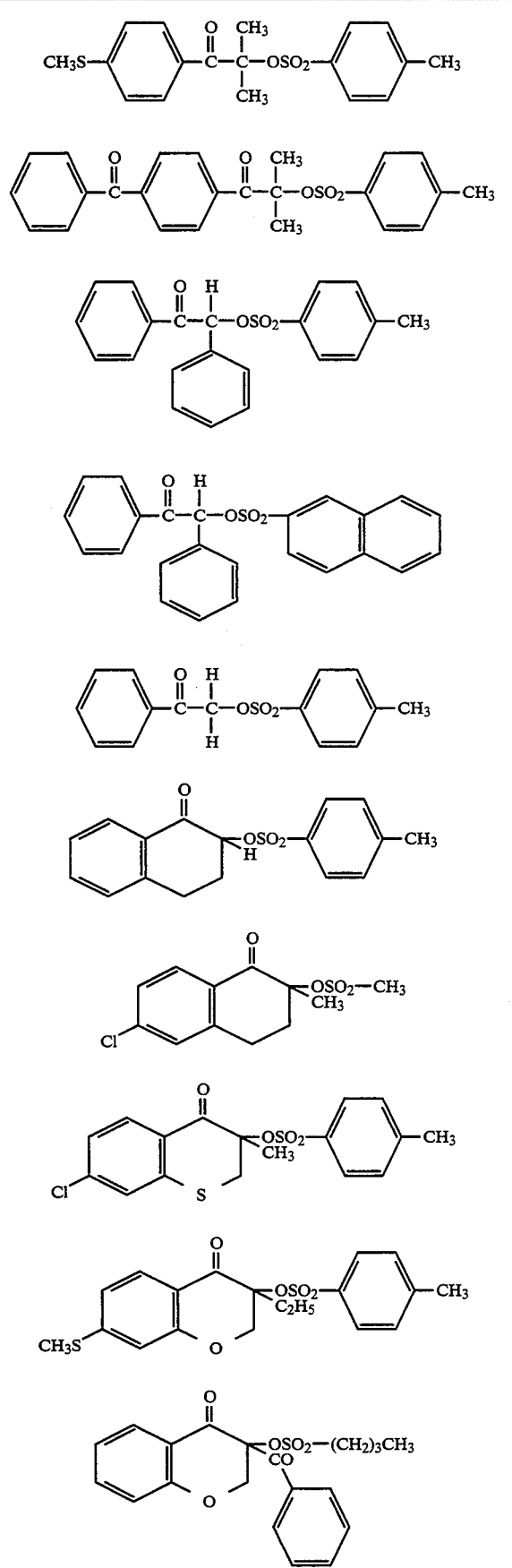
TABLE B-continued
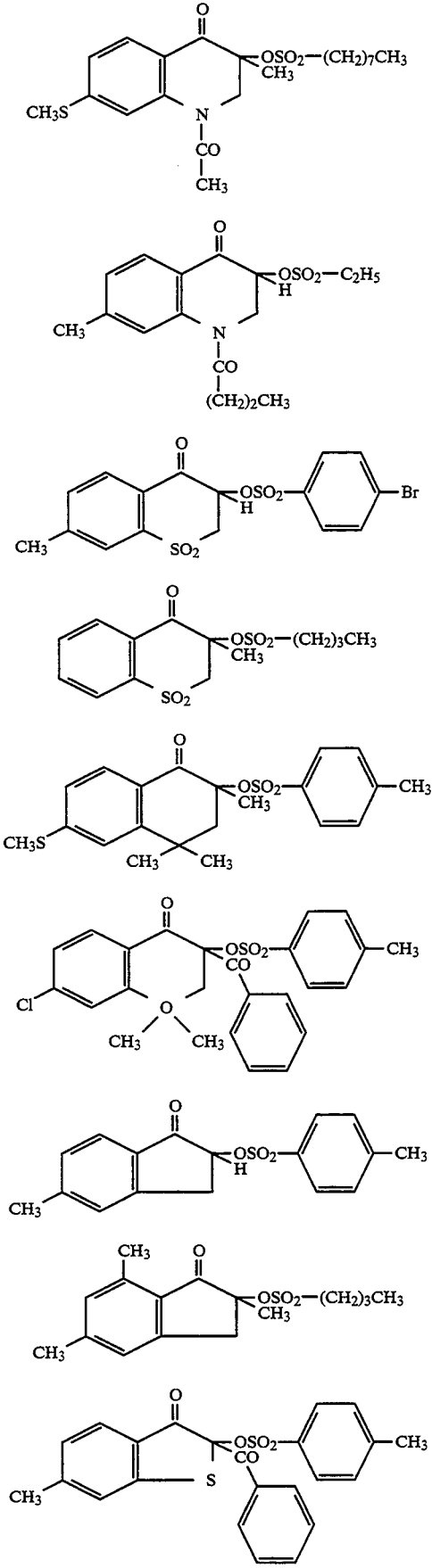

TABLE B-continued
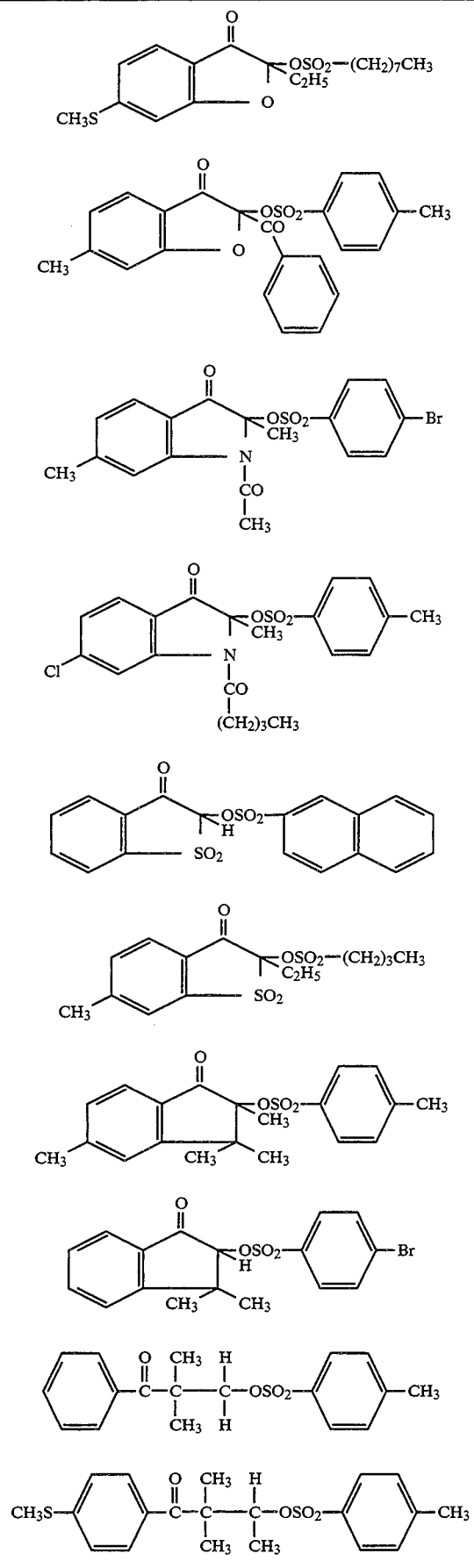
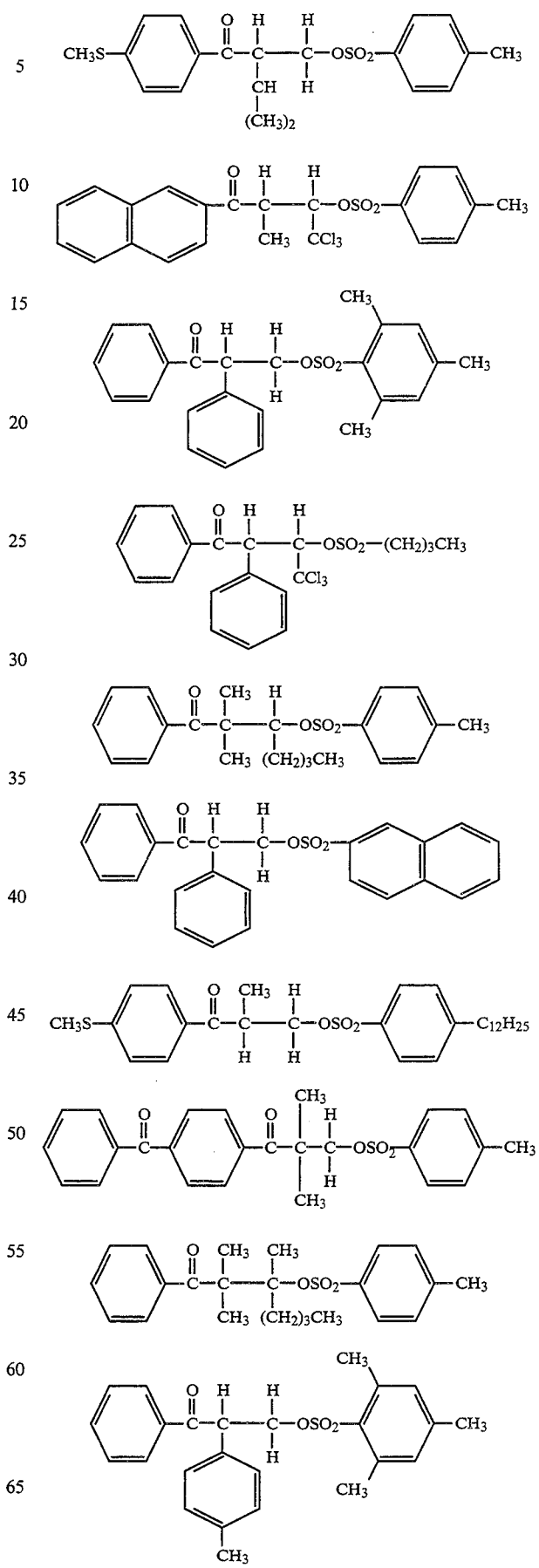

TABLE B-continued

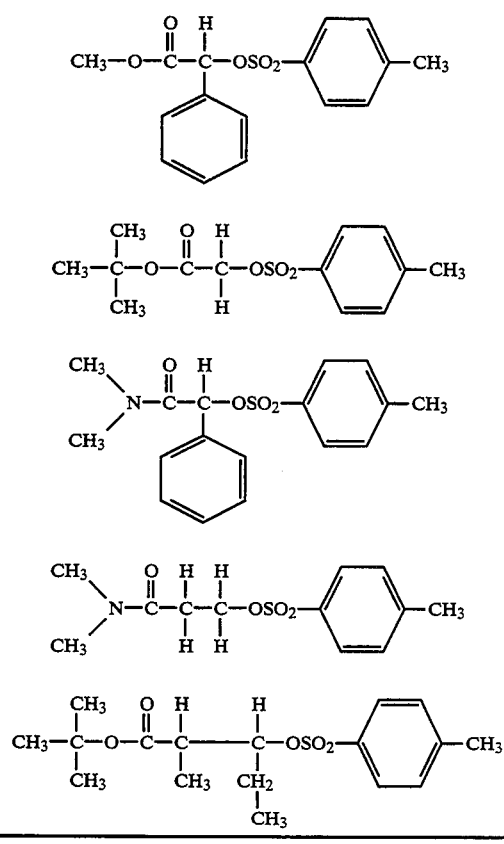

What is claimed is:

1. A photosensitive composition comprising:
   an alkali-soluble polymer;
   a compound which generates an acid when exposed to chemical radiation; and
   an acid-decomposable compound having (a) at least one substituent which is an ester moiety, tetrahydropyranyl ether, an alkoxycarbonyl or a silyl ether, which substituent is decomposed by acid which is generated when said compound is exposed to chemical radiation, and (b) at least one group which is converted into a —COO⁻ or —SO₃⁻ group by reaction with an alkaline solution.

2. The photosensitive composition of claim 1, wherein said substituent decomposable by acid is an ester selected from the group consisting of t-butyl ester, isopropyl ester, ethyl ester, methyl ester and benzyl ester; tetrahydropyranyl ether; an alkoxycarbonyl selected from the group consisting of t-butoxycarbonyl, methoxycarbonyl and ethoxycarbonyl; or a silyl ether selected from the group consisting of trimethylsilyl ether, triethylsilyl ether and triphenylsilyl ether.

3. A photosensitive composition according to claim 1, wherein the compound which generates an acid when exposed to chemical radiation is an onium salt.

4. A photosensitive composition according to claim 3, wherein the onium salt is at least one member selected from the group consisting of a diazonium salt, a phosphonium salt, a sulfonium salt and an iodonium salt.

5. A photosensitive composition according to claim 3, wherein the counter anion of the onium salt is at least one Lewis base selected from the group consisting of methanesulfonate anion, trifluoroacetate anion, trifluoromethanesulfonate anion and toluenesulfonate anion.

6. A photosensitive composition according to claim 1, wherein the alkali-soluble polymer is phenol-novolak resin.

7. A photosensitive composition according to claim 1, wherein the alkali-soluble polymer has a softening point of at least 150° C. and an average molecular weight ranging from 3000 to 8000.

8. A photosensitive composition according to claim 7, wherein the alkali-soluble polymer is a novolak resin having a copolymer composition which comprises at least two components selected from the group consisting of 2,5-xylenol, 3,5-xylenol, m-cresol, p-cresol, and o-cresol, in which the copolymer composition comprises at least 20 to 60 parts by weight of xylenol.

9. A photosensitive composition according to claim 8, wherein the alkali-soluble polymer comprises polyvinyl phenol.

10. A photosensitive composition according to claim 1, wherein the acid-decomposable compound is used in an amount of 1 to 200 parts by weight, while the alkali-soluble polymer is used in an amount of 100 parts by weight.

11. A photosensitive composition according to claim 1, wherein the compound which generates an acid when exposed to a chemical radiation is used in an amount of 0.01 to 20% by weight, based on the weight of the solid components of the photosensitive composition.

12. A photosensitive composition, comprising:
    an alkali-soluble polymer;
    a compound which generates an acid when exposed to chemical radiation; and
    an acid-decomposable compound having the structure of formula (1)

wherein $R^1$ and $R_2$ are either the same or different, each of which represents at least one member selected from the group consisting of hydrogen, halogen, cyano, nitro, silyl and a monovalent organic group; X represents $>C=O$ or —SO₂—; Y represents a divalent organic group; $R^1$ and $R_2$ can be bonded together, forming a ring; and at least one of $R_1$ and $R_2$ and Y is a substituent which is an ester moiety, tetrahydropyranyl ether, an alkoxycarbonyl or a silyl ether, said substituent being decomposed by acid which is generated when said compound is exposed to chemical radiation, and said acid-decomposable compound having at least one group which is converted into a —COO⁻ or SO₃— group upon reaction with an alkaline solution.

13. A photosensitive composition according to claim 12, wherein said substituent decomposable by an acid is t-butyl ester, isopropyl ester, ethyl ester, methyl ester, benzyl ester, tetrahydropyranyl ether, t-butoxycarbonyl, methoxycarbonyl, ethoxycarbonyl, trimethylsilyl ether, triethylsilyl ether or triphenylsilyl ether.

14. A photosensitive composition according to claim 13, wherein said acid decomposable substituent is t-butyl ester or t-butoxycarbonyl.

15. A photosensitive composition, comprising:
an alkali-soluble polymer;
a compound which generates an acid when exposed to chemical radiation; and
an acid-decomposable compound which has the structure of one of the following formulas (2), (3) and (4):

Formula (2):

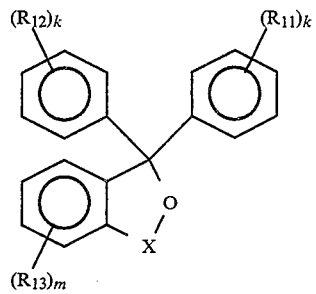

Formula (3):

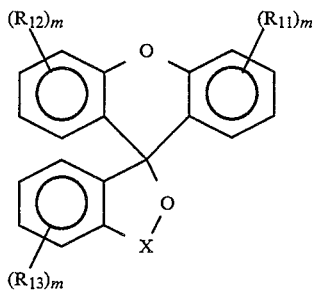

Formula (4):

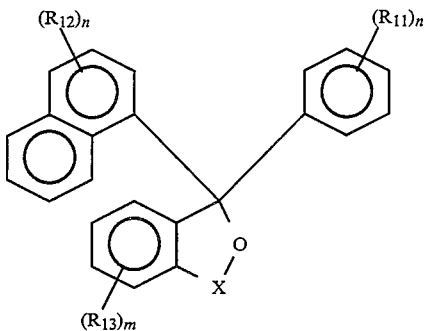

wherein $R_{11}$, $R_{12}$ and $R_{13}$ are eight the same or different, each of which represents at least one member selected from the group consisting of hydrogen, halogen, cyano, nitro, silyl and monovalent organic group; X represents $>C=O$ or $-SO_2-$; k is an integer ranging from 1-5; m is an integer ranging from 1-4; n is an integer ranging from 1-7; and at least one of $R_{11}$, $R_{12}$ and $R_{13}$ is an acid decomposable substituent decomposed by acid which is generated when said compound is exposed to chemical radiation and which is an ester moiety, tetrahydropyranyl ether, an alkoxycarbonyl or a silyl ether; and said acid decomposable compound having at least one group which is converted into a $-COO^-$ or $-SO_3^-$ group by reaction with an alkaline solution.

16. A photosensitive composition according to claim 15, wherein said acid decomposable substituent is t-butyl ester, isopropyl ester, ethyl ester, methyl ester, benzyl ester, tetrahydropyranyl ether, t-butoxycabonyl, methoxycarbonyl, ethoxycarbonyl, trimethylsilyl ether, triethylsilyl ether or triphenylsilyl ether.

17. A photosensitive composition according to claim 15, wherein each of the compounds represented by formula (II), (III) or (IV) is selected from the group consisting of derivatives of cresolphthalein, phenolphthalein and thymolphthalein in which at least one hydroxy group has been blocked with an acid-decomposable substituent.

18. A photosensitive composition according to claim 17, wherein the acid decomposable substituent is t-butyl ester or t-butoxycarbonyl.

19. A photosensitive composition comprising:
70 to 80% by weight of the alkali-soluble polymer represented by the following formula (i):

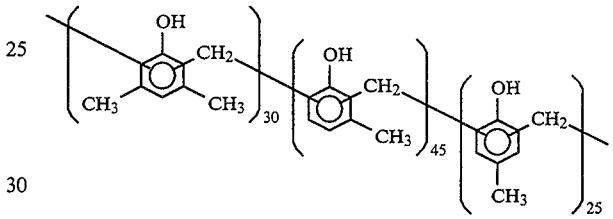

30 to 15% by weight of cresolphthalein di-t-butyl carbonate; and
0.3 to 4.0% by weight of triphenylsulfonium triflate.

20. A method of forming a pattern comprising the steps of:
forming a photosensitive layer on a substrate, the photosensitive layer containing as a main component the photosensitive composition according to any one of claims 1, 12 and 15;
selectively exposing a predetermined region of the photosensitive layer to a chemical radiation;
applying a baking treatment to the photosensitive layer after the exposure to chemical radiation; and
developing the photosensitive layer after the baking treatment so as to selectively remove the predetermined region of the photosensitive layer.

21. A method of forming a pattern, comprising the steps of:
forming a photosensitive layer on a substrate, the photosensitive layer containing, as the main component, the photosensitive composition of claim 1;
selectively exposing a predetermined region of the photosensitive layer to chemical radiation, thereby generating an acid;
baking the photosensitive layer after exposure to chemical radiation, thereby decomposing the substituent (a) in the acid-decomposable compound, by the acid generated in the preceding steps; and
developing the photosensitive layer after the baking step with an alkaline solution, and converting the group (b) in the acid decomposable compound into a $-COO^-$ or $-SO_3^-$ group, thereby selectively removing the predetermined region of the photosensitive layer.

* * * * *

UNITED STATES PATENT AND TRADEMARK OFFICE
CERTIFICATE OF CORRECTION

PATENT NO. : 5,332,648
DATED : July 26, 1994
INVENTOR(S) : Naoko KIHARA, et al.

It is certified that error appears in the above-indentified patent and that said Letters Patent is hereby corrected as shown below:

On the title page, Item. [54] and Column 1, Lines 2-3, the title should read as follows:

--PHOTOSENSITIVE COMPOSITION AND METHOD OF FORMING A
  PATTERN USING THE SAME--

Signed and Sealed this

Twentieth Day of December, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,332,648
DATED : JULY 26, 1994
INVENTOR(S) : NAOKO KIHARA ET AL

It is certified that error appears in the above-identified patent and that said Letters Patent is hereby corrected as shown below:

Column 4, Formula 4, " 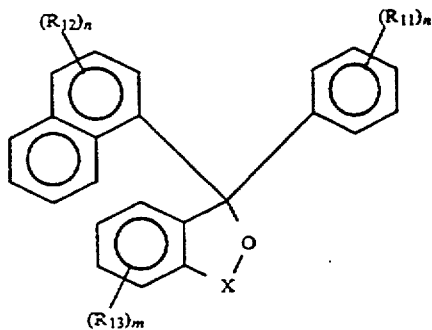 "

should read -- 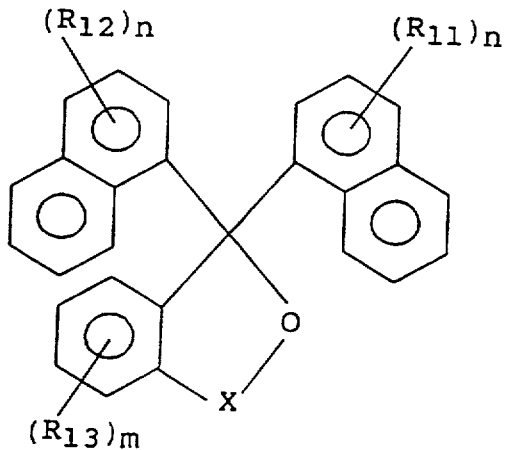 --.

UNITED STATES PATENT AND TRADEMARK OFFICE
CERTIFICATE OF CORRECTION

PATENT NO. : 5,332,648

DATED : JULY 26, 1994

INVENTOR(S) : NAOKO KIHARA ET AL

It is certified that error appears in the above-identified patent and that said Letters Patent is hereby corrected as shown below:

Column 39, Formula 4, " 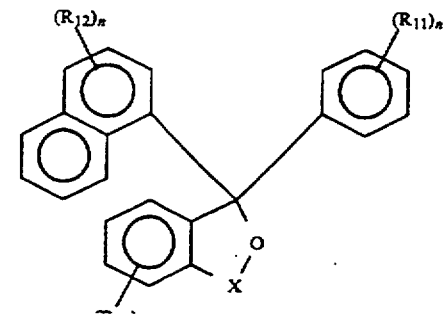 "

UNITED STATES PATENT AND TRADEMARK OFFICE
CERTIFICATE OF CORRECTION

PATENT NO. : 5,332,648
DATED : July 26, 1994
INVENTOR(S) : Naoko Kihara, et al.

It is certified that error appears in the above-indentified patent and that said Letters Patent is hereby corrected as shown below:

should read -- Formula (4): --.

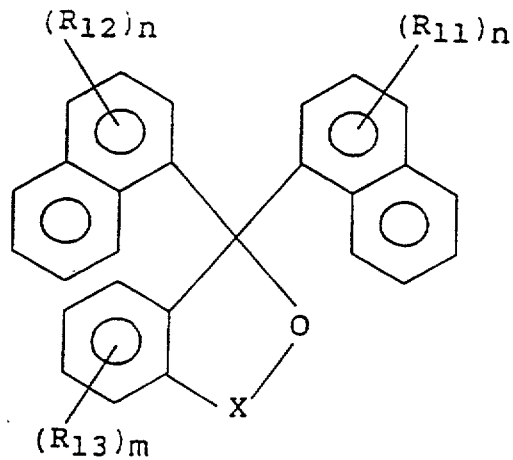

Signed and Sealed this

Twentieth Day of June, 1995

Attest:

BRUCE LEHMAN

Attesting Officer       Commissioner of Patents and Trademarks